United States Patent [19]

Bång

[11] Patent Number: 5,745,504
[45] Date of Patent: Apr. 28, 1998

[54] BIT ERROR RESILIENT VARIABLE LENGTH CODE

[75] Inventor: Karl Göran Bång, Järfälla, Sweden

[73] Assignee: Telefonaktiebolaget LM Ericsson, Stockholm, Sweden

[21] Appl. No.: 668,460

[22] Filed: Jun. 25, 1996

[51] Int. Cl.$^6$ .................. H03M 7/42; H03M 13/00
[52] U.S. Cl. .................. 371/37.1; 341/67; 341/94; 371/37.8
[58] Field of Search .................. 371/37.1, 37.8; 341/67, 94

[56] References Cited

U.S. PATENT DOCUMENTS

| | | | |
|---|---|---|---|
| 3,701,111 | 10/1972 | Cocke et al. | 340/172.5 |
| 3,717,851 | 2/1973 | Cocke et al. | 340/172.5 |
| 5,079,548 | 1/1992 | Fujiyama et al. | 341/67 |
| 5,408,234 | 4/1995 | Chu | 341/106 |
| 5,550,542 | 8/1996 | Inoue | 341/67 |
| 5,663,721 | 9/1997 | Rossi | 341/51 |

FOREIGN PATENT DOCUMENTS

0717503 A2  6/1996  European Pat. Off. .

OTHER PUBLICATIONS

Richard Ivy, "Advanced Video Coding—Dallas Closing Report", ITU Rapporteur for Very Low Bitrate Visual Telephony, Document LBC-96-153, Dallas, Texas, Apr. 1996.
ITU-T Draft H.263 "Video Coding for Low Bitrate Communication", p. 19, VLC Table for MVD.
Proceedings of the Singapore Conference on Information Engineering, 6–11 Sep. 1993, New York, US, pp. 1062–1066, XP002019211 Ghim Hwee Ong and Shell Ying Huang: "Compression of Chinese text files using a multiple four-bit coding scheme".
IEEE Transactions on Communications, vol. 43, No. 2/4, Feb. 1995, New York, US, pp. 158–162, XP00506544; Takishima et al.; "Reversible variable length codes".
IEEE Transactions on Information Theory, vol. 31, No. 6, Nov. 1985, New York, US, pp. 794–801, XP002019212; Maxted & Robinson: "Error recovery for variable length codes".

*Primary Examiner*—Stephen M. Baker
*Attorney, Agent, or Firm*—Burns, Doane, Swecker & Mathis, L.L.P.

[57] ABSTRACT

Data is transmitted and received over a channel in a telecommunications system includes encoding the data by providing a plurality of fixed length code tables, wherein each of the fixed length code tables has a size that is different from a size of every other fixed length code table, and encoding the data as a plurality of information code words, wherein each information code word is a selected value from one of the fixed length code tables. A plurality of marker codes is also provided, wherein the marker codes are variable length codes. A unique one of the marker codes is then associated with each of the fixed length code tables, and channel code words are generated by inserting the associated marker code one bit at a time into each of the information code words at a fixed bit interval. The encoded data may be decoded by processing in a forward direction to extract and decode marker code words. Information code bits associated with valid decoded marker code words are extracted and decoded. When an invalid marker code word is extracted, backwards processing is commenced to extract and decode marker code words until an invalid marker code is detected in the backwards direction. An error interval is defined by the positions of the invalid marker code words detected in the forward and backwards directions. Only those valid information code words associated with marker code words that lie outside of the error interval are output for further processing.

36 Claims, 8 Drawing Sheets

301 — ENCODED SEQUENCE : 1,00,00,1,1,1,0110,00,1,1,00,0110,1,1,00

303
BIT ERROR
↓

305 — RECEIVED SEQUENCE : 1 00 00 1 1 1 0110 01 1 1 00 0110 1 1 00

307 — FORWARD DECODING : 1,00,00,1,1,1,0110,0111 (ERROR DETECTED IN MC; START BACKWARD DECODING)

309 — BACKWARD DECODING : 1110,1,1,00,1,1,1,00,0110,1,1,00

ERRONEOUS REGION : ←——→
311

313 — DECODED SYMBOLS : 1,00,00,                ,00,0110,1,1,00

*FIG. 3*

BIT ERROR RESILIENT VARIABLE LENGTH CODE

BACKGROUND

The present invention relates to the use of variable length codes to compress information that is transmitted over an error prone channel, and more particularly to an efficient low complexity encoder and decoder for a bit error resilient variable length code.

In video coding and other application fields where variable length codes (VLCS) are used to compress the number of bits of the information source in order to be able to transmit the information over a bandlimited channel, a severe problem occurs when the channel introduces bit errors. Even if the codes are designed in such a way that they are instantaneous, (i.e., the decoder can instantly and correctly decode encoded code words), this property is lost when decoding takes place after bit errors have been introduced on the channel.

When the encoded data has been corrupted by bit errors, the decoder may eventually synchronize to the received bit stream, or to a special synchronization word, but a large amount of data may be lost in the meantime. For example, in video coding applications, the picture quality may suffer severely from bit errors due to loss of synchronization in the decoding procedure.

In application fields in which the information is to be perceived by a human being, such as video or audio applications, the encoding process can utilize the characteristics of the human visual or audio system to adapt the source coded bits to include only that which is relevant from a perception point of view. For example, in a video application, high frequency components may be discarded without any noticeable degradation in the picture quality. This is an example of lossy compression, that is, compression in which the output from the decoder is not the same as the input to the encoder.

A basic result shown by Shannon is that the problem of transmitting a message over a channel can almost always be divided into separate optimization of the source encoder/decoder and the channel encoder/decoder, without any loss in performance. These aspects will now be discussed separately.

Source coding

In a perception based coding scheme, both lossy and lossless coding can be used to reduce the bitrate to a level required for the bandlimited channel. The lossy compression is often applied to the transformed (e.g., fast Fourier transform (FFT), discrete cosine transform (DCT), etc.) input signal. This operation is called quantization. The transformed and quantized signal is then further compressed by using any of the lossless compression methods.

Variable length coding is one such lossless compression method that is often used to compress the number of bits needed to represent the information of an information source. Efficient coding techniques exist for designing such codes, such as Huffman coding, Arithmetic coding and Ziv Lempel coding. The basic idea in these techniques is to select short code words to represent source symbols that occur frequently and longer code words to represent source symbols that occur rarely. The utmost limit in terms of average number of bits per source symbol to represent the source with an arbitrary degree of accuracy corresponds to the entropy of the source.

Depending on the probability distribution function (pdf) of the source symbols, it is possible to come very close to the entropy of the source and in some instances it is even possible to reach the entropy of the source. Hence, the coding methods are very efficient from an information point of view.

However, the more efficient the source coding is, the more important each bit in the encoded bit stream is. Consequently, the occurrence of a bit error in the encoded bit stream will affect a large portion of the decoded (redundant) bit stream. Therefore, it is usually necessary to protect the information bit stream in one way or another. Channel coding is used for this purpose.

Channel coding

Many different forward error correction (FEC) techniques exist for detecting and correcting bit errors on the channel. The determination of which method to use depends on factors such as the bit error statistics (e.g., bit error rate, random or burst errors, etc.), the amount of allowable delay for decoded symbols, the acceptable residual bit error rate or frame rate, and the like.

The channel coding methods can be divided into block codes and convolutional codes. Examples of the former are Bose, Chaudhuri, and Hocquenghem (BCH) codes and Reed-Salomon codes; examples of the latter include trellis codes and Rate-Compatible Punctured Convolutional Codes (RCPC) with Viterbi decoding.

Common to all of these methods is the fact that they add a certain number of bits in a controlled way to the transmitted bit stream. The decoder can then utilize these redundant bits in the decoding procedure to detect or correct bit errors.

Automatic Repeat on Request (ARQ)

Where a transmission system is two-way (i.e., where information can be sent in both directions between the communicating entities), it may not be necessary to correct the error at the receiving side. Instead, it may be sufficient to merely detect that an error has occurred by adding a certain number of bits based on the bits in the information block. Cyclic Redundancy Check (CRC) bits are one example. The receiver also computes the redundant bits based on the received bits in the information block, and a syndrome is formed that compares the received CRC bits with the calculated CRC bits. If there is a difference, then the transmitted block has been corrupted by one or more bit errors. In response to the detection of bit errors, a message may be sent to the transmitter with a request for retransmission of the erroneous block. This technique is called Automatic Repeat on Request (ARQ). Alternatively, the whole block may be discarded, and an attempt can be made to substitute another block that will conceal the occurrence of the error. For example, in a video application, a block from a previous frame might be used in place of a block that is found to contain an error.

Each error correction or detection method has its own merits and drawbacks. First of all, each one adds bits to the encoded bit stream. With respect to FEC, the more bits that are added, the more powerful the error correction ability. On the other hand, adding bits decreases the compression efficiency, and increases decoding delay, which may be a nuisance. On noisy channels with a high bit error rate, the FEC may not only become incapable of correcting the bit errors but may also add further bit errors.

For ARQ, the overhead in terms of added number of CRC bits to the information bit stream may be rather modest. However, the method requires a secure (highly protected) backward channel for transmitting the message of request for retransmission of erroneous blocks. Here, to determine the delay for receiving the correct information block, the delay in both the backward channel and the forward channel has to be added and if several retransmissions are necessary the delay becomes multiples of that figure.

SUMMARY

It is therefore an object of the present invention to provide a simple technique for encoding and decoding data.

It is a further object of the present invention to provide a simple encoding and decoding technique that requires relatively low redundancy.

It is yet another object of the invention to provide an encoding and decoding technique that does not require a backward channel, and which has a self-synchronizing property.

In accordance with one aspect of the present invention, the foregoing and other objects are achieved in a method and apparatus for transmitting data over a channel in a telecommunications system, the method and apparatus involving providing a plurality of fixed length code tables, wherein each of the fixed length code tables has a size that is different from a size of every other fixed length code table; and encoding the data as a plurality of information code words, wherein each information code word is a selected value from one of the fixed length code tables. A plurality of marker codes are also provided, wherein the marker codes are variable length codes. A unique one of the marker codes is then associated with each of the fixed length code tables. Channel code words are generated by inserting the associated marker code one bit at a time into each of the information code words at a fixed bit interval. The channel code words may then be transmitted over the channel.

The plurality of marker codes may be a compact short variable length code that satisfies the relationship:

$$\sum_{k=0}^{M-1} 2^{-l(k)} \leq 1$$

where k is an index that designates one of the marker codes, l(k) is the length of the marker code designated by the index k, and M is the number of marker codes. Further, at least one of the marker codes may be designated as an invalid marker code that is not to be associated with any of the fixed length code tables.

In another aspect of the invention, a block of data bits encoded as described above may be received from the channel, wherein the block of data bits has a first end designated as a start of block, and a second end designated as an end of block. Then, starting at the start of block, the block of data bits is processed in a forward direction by extracting every n+1 bits, where n is an integer greater than or equal to 1, wherein the extracted bits are designated extracted marker code bits. It is then determined whether the extracted marker code bits constitute a valid one of a plurality of marker code words, wherein the marker codes are variable length codes. If the extracted marker code bits constitute a valid one of the plurality of marker code words, then for every one of the marker code word bits, n previously not extracted bits from the block of data bits are extracted for use as a received information code word. A determination is then made regarding whether the received information code word is a valid member of a fixed length code table. If the received information code word is a valid member of the fixed length code table, then the received information code word is stored for subsequent processing.

The above technique covers the situation where no errors are detected during forward processing. In another aspect of the invention, if the extracted marker code bits do not constitute a valid one of the plurality of marker code words, then a position of the forward extracted marker code bits is stored. Then, starting at the end of block, the block of data bits is processed in a backwards direction by extracting every n+1 bits, where n is an integer greater than or equal to 1, the backwards extracted bits being designated backwards extracted marker code bits. Next, it is determined whether the backwards extracted marker code bits constitute a valid one of the plurality of marker code words. If the backwards extracted marker code bits constitute a valid one of the plurality of marker code words, then for every one of the marker code word bits, n previously not extracted bits are extracted from the block of data bits for use as a backwards received information code word. It is next determined whether the backwards received information code word is a valid member of a fixed length code table. If the backwards received information code word is a valid member of the fixed length code table, then the backwards received information code word is stored for subsequent processing.

In another aspect of the invention, if the backwards extracted marker code bits do not constitute a valid one of the plurality of marker code words, then a position of the backwards extracted marker code bits is stored.

If the stored position of the forward extracted marker code bits is closer to the end of block than is the stored position of the backwards extracted marker code bits, then an error interval, defined by the stored position of the backwards extracted marker code bits and the stored position of the forward extracted marker code bits, is determined. Any stored information code words that are outside the error interval may then be output.

In an alternative embodiment, backwards processing may begin at the point where the invalid marker code word is first detected during forward processing, rather than at the end of block. After an error interval is determined as described above, forward processing resumes from the point after which it last left off. When the end of block is reached, one or more error intervals may have been defined. Only those valid information code words lying outside of the error intervals are output for further processing.

BRIEF DESCRIPTION OF THE DRAWINGS

The objects and advantages of the invention will be understood by reading the following detailed description in conjunction with the drawings in which:

FIG. 3 is another example of decoding an encoded bit stream in accordance with the invention;

DETAILED DESCRIPTION

Figure 1:
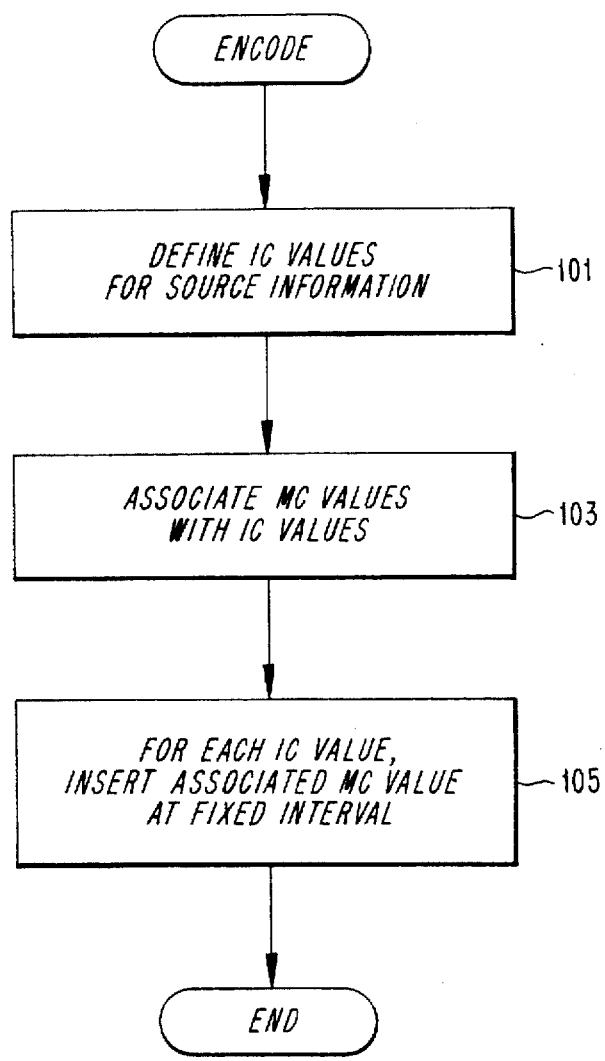
FIG. 1 is a flowchart for encoding source data in accordance with one aspect of the invention.

The various features of the invention will now be described with respect to the figures, in which like parts are identified with the same reference characters.

The inventive encoding and decoding techniques described herein are particularly applicable in situations where a priori information is known about the source, that is, knowledge of the probability density function (pdf) of the source symbols, the number of source symbols in a block and/or a particular code word that signifies end of block. Since the inventive techniques do not always prevent the occurrence of bit errors, the invention may be usefully applied to encode/decode data representing humanly perceivable information, such as visual or audio information, where different error concealment methods can be used to mask the effect of bit errors. For this to be possible, the decoder must know that there are bit errors confined to a particular interval in the bit stream.

Overview

One aspect of the invention relates to the design of an efficient low complexity variable length code (VLC) encoder that makes use of both a priori information about the source and also error concealment methods for humanly perceivable information to achieve a VLC with a short average word length that still permits the decoder to detect bit errors and keep synchronization.

Another aspect of the invention relates to the design of an efficient low complexity decoder for the inventive VLC that decodes the received bit stream, detects the occurrence of bit errors and identifies a confined interval or intervals in which the detected bit errors occurred.

The inventive VLC comprises two components: an information code (IC) and a marker code (MC). The IC conveys the source information to be transmitted over the channel, and is designed to be a set of fixed length code tables with different lengths.

It will be observed that it may not be possible to determine the length of the ICs merely by looking at a received bit stream. For example, where ICs may have a length of two or four bits, the bit stream "0010 . . . " may represent two two-bit long ICs (00 followed by 10), or it may alternatively represent a single four-bit long IC (0010). In order to allow the decoder to distinguish between such alternative possibilities, each IC has associated with it a particular MC, the value of which indicates the length of the IC. The IC and MC in combination are referred to as a channel code (CC). In accordance with one aspect of the invention, the MC is a VLC whose length can be determined from the value of the code itself. Thus, so long as the MC can be decoded, the length of the associated IC can be determined. Knowledge of the length of the IC is then utilized to decode the associated IC. It will be recognized that because the MC is a VLC, and because the ICs need not be of uniform length, the CC is itself a VLC.

In accordance with another aspect of the invention, the MCs can also be used to detect and localize the occurrence of a bit error to a confined interval within the received bit stream. This aspect of the invention is made possible by using only a subset of all possible MC words. Both forward and backward decoding of MCs are used for detecting and localizing the bit errors.

The invention will now be described in greater detail with reference to exemplary embodiments of an encoder and a decoder.

Encoder

It is assumed that a memory free source A is provided, with N source symbols, $A=\{a(0), a(1) \ldots, a(N-1)\}$. The corresponding probability for the occurrence of $a(k)$ is $p(k)$, $0 \leq k \leq N-1$.

The entropy of source A is $$H_A = -\sum_{k=0}^{N-1} p(k)\log_2(p(k)) \quad (1)$$

It can be shown that the shortest possible average word length that can be obtained for a code to be uniquely decodable corresponds to the entropy $H_A$ of the source.

The average word length $l_{mean}$ for a code $C=\{c(0), c(1), \ldots, c(N-1)\}$, is defined as $$l_{mean} = \sum_{k=0}^{N-1} p(k)l(k) \quad (2)$$

where $l(k)$ is the word length (in number of bits) for code word $c(k)$.

As mentioned in the BACKGROUND section, techniques exist for designing a code having an average word length that achieves or comes arbitrarily close to the entropy. However, when this is done there is no redundancy in the code words that can be used for error detection or correction. Therefore, some redundant bits have to be inserted in the code words. In order to minimize the number of these additional bits, one aspect of the invention utilizes the characteristics of human perception to allow the decoding of some bits to be skipped, where it is known that there are errors, in order to get a graceful degradation of the picture or audio. For example, the more it is possible to determine that the bit errors occurred in a highly localized interval within the received bit stream, the more useful information there is that can be correctly decoded, and the less noticeable the degradation will be. What to do with those received bits that lie within the localized interval will depend on the application. For example, in a video application graceful degradation of picture quality may be achieved by freezing the previous frame (or part of a frame) instead of displaying the current erroneous frame (or the erroneous part of the frame).

In accordance with one aspect of the invention, the technique used in the encoder to achieve an efficient source coding (close to entropy) and still be able to detect bit errors will now be described with reference to FIG. 1.

First, a set of IC values are selected that will be used for encoding the source information (step 101). The entire set of IC values may comprise a number of subsets of IC values, each subset having a unique bit length. For example, one subset of IC values may consist of two-bit codes, and a second subset of IC values may consist of four-bit codes. Thus, the IC in each subset is a fixed length code (FLC), while the collection of subsets together make up a variable length code. Any FLC design technique may be used for defining the set of IC values (e.g., straight binary code, Gray code, etc.), but in an error prone environment, it is advantageous to use an error resilient code, such as the Baang-1 or Baang-2 codes described in U.S. Provisional Application No. 60/007,614, which is hereby incorporated by reference in its entirety.

Next, MC values are defined, such that for each subset of IC values there is one MC. Each of the MC values is then associated with one of the subsets of IC values so that for each subset, there is a corresponding (unique) MC value (step 103). In this way, the MC value can be used to indicate the length of the associated IC code.

The MC is formed as an instantaneous compact code where all code words, except for at least one, are used in the encoding process. For example, an instantaneous compact MC with a maximum of three bits may have the following code words:

1
00
010
011

This code fulfills the Kraft inequality $$\sum_{k=0}^{M-1} 2^{-l(k)} \leq 1 \qquad (3)$$

because the sum indicated on the left side of the relational operator is, in this example, equal to 1. This shows that the code is compact. In equation (3), k is an index variable, M is the number of MC codes, and l (k) is a function representing the length of the MC designated by the index k. Although in this example the Kraft inequality is satisfied with the left side of the relation being equal to the right side, in general the invention may be practiced so long as the selected MCs at least satisfy the inequality. It is preferred, however, that the Kraft inequality be satisfied by means of equality, as illustrated.

In this case, the code word 011 is not to be used, and is therefore an invalid code word. Throughout this description, invalid code words will be designated by the appearance of an underline below the code word. As will be explained below, the fact that certain code word values are considered to be invalid is used during the decoding process to detect the occurrence of bit errors in the received bit stream.

Table 1 illustrates how a set of MC values may be generated:

TABLE 1

| | | MC VALUES | | |
|---|---|---|---|---|
| 1-BIT MC VALUES | 2-BIT MC VALUES | 3-BIT MC VALUES | 4-BIT MC VALUES | N-BIT MC VALUES |
| 1 | | | | ... |
| 0 | 00 | | | ... |
| | 01 | 010 | | ... |
| | | 011 | 0110 | ... |
| | | | 0111 | ... |

It will be recalled that underlined values in the table represent invalid code values. It can be seen from the table that having selected the value "1" as a valid one-bit MC code, the value "0" cannot also be used as a valid one-bit MC code because an ambiguity would exist as to whether a bit-stream contained the one-bit value "0" or the two bit value "00." Similar observations can be made with respect to the selection of codes so as to avoid ambiguities between two- and three-bit values, three- and four-bit values, and so on. Thus, the valid MC values lie on the diagonal beginning with the one-bit value "1". It can be seen that for each code-word length, there is only one valid code value.

In a preferred embodiment, the shortest MC values are allocated to the source symbols having the highest probability of occurrence. Source symbols with less probability get increasingly longer MCs. Recalling that the combination MC value/IC value is a channel code (CC), CC words with a one-bit long MC will be denoted throughout this description as belonging to Class 1, CC words with a two-bit long MC will be denoted as belonging to Class 2, and so on.

Finally, a time-dispersion process is performed wherein, for each IC value, the individual bits of the associated MC value are inserted at a fixed interval into the IC (step 105). This interval may alternatively be set to be every second bit, every third bit, every fourth bit, and so on. The resulting code is the CC.

Although the first two steps (101 and 103) have been described above in connection with the encoding process, it will be recognized that having performed these steps once as a preliminary matter, it is unnecessary to repeat them for each and every IC value to be encoded. Rather, the IC and MC values can be predefined and associated with one another once, and thereafter used whenever a new IC value is to be encoded.

The maximum number of CC words associated with each Class is a function of the minimum CC word length (denoted here as min $l_{min}$) and the Class-number.

Table 2 below shows the relationship between $l_{min}$ class, CC word length (defined as $l(k)=kl_{min}$), the maximum number of words for a given class ($=2^{l(k)-k}$). The last column (Accumulated number of words) shows how many code words are available if all code words having a given class or smaller are selected for inclusion in the set of valid CC words. This information is useful when designing a code because the number of source symbols will be equal to the number of code words. Table 2 is by no means exhaustive, but merely illustrates the properties for $l_{min} = 2$, 3 and 4.

TABLE 2

| Code type $l_{min}$ | Class k | Word length $l(k)=kl_{min}$ | Max. no. of words = $2^{l(k)-k}$ | Accumulated no. of words |
|---|---|---|---|---|
| 2 | 1 | 2 | 2 | 2 |
| 2 | 2 | 4 | 4 | 6 |
| 2 | 3 | 6 | 8 | 14 |
| 2 | 4 | 8 | 16 | 30 |
| 2 | 5 | 10 | 32 | 62 |
| 2 | 6 | 12 | 64 | 126 |
| 2 | 7 | 14 | 128 | 254 |
| 2 | 8 | 16 | 256 | 510 |
| 3 | 1 | 3 | 4 | 4 |
| 3 | 2 | 6 | 16 | 20 |
| 3 | 3 | 9 | 64 | 84 |
| 3 | 4 | 12 | 256 | 340 |
| 4 | 1 | 4 | 8 | 8 |
| 4 | 2 | 8 | 64 | 72 |
| 4 | 3 | 12 | 512 | 584 |

Table 3 below shows exemplary code assignments for three different code types: $l_{min}=2$, $l_{min}=3$ and $l_{min}=4$ (hereinafter denoted throughout this disclosure by the terms lmin2, lmin3 and lmin4, respectively). The notation 'x' in the table signifies a "don't care" bit in the IC part of the CC, in the sense that the indicated bit in the IC can be either a "0" or a "1". However, for each class of CC, the combination of value assignments in any given IC portion of the CC should be distinct from values assigned to the IC portion of other CCs in that same class. This may be achieved, for example, by using a fixed length Baang-2 code to generate the IC portions of the CC for any given class of CC.

Parameters that affect the choice of CC are:

the number of source symbols;

the actual or estimated pdf;

the maximum length of the MC-VLC (a short MC-VLC may detect an error faster than a longer code) ; and the number of valid code words within each class.

TABLE 3

| Index | Code type:lmin2 | Code type:lmin3 | Code type: lmin4 |
|---|---|---|---|
| 0 | 0x1x1x1x0x | 0xx1xx0xx | 0xxx0xxx |
| 1 | 0x1x1x1x0x | 0xx1xx0xx | 0xxx0xxx |
| 2 | 0x1x1x1x0x | 0xx1xx0xx | 0xxx0xxx |
| 3 | 0x1x1x0x | 0xx1xx0xx | 0xxx0xxx |
| 4 | 0x1x1x0x | 0xx1xx0xx | 0xxx0xxx |
| 5 | 0x1x1x0x | 0xx1xx0xx | 0xxx0xxx |
| 6 | 0x1x1x0x | 0xx1xx0xx | 0xxx0xxx |
| 7 | 0x1x1x0x | 0xx1xx0xx | 0xxx0xxx |
| 8 | 0x1x1x0x | 0xx0xx | 0xxx0xxx |
| 9 | 0x1x1x0x | 0xx0xx | 0xxx0xxx |
| 10 | 0x1x1x0x | 0xx0xx | 0xxx0xxx |
| 11 | 0x1x0x | 0xx0xx | 0xxx0xxx |
| 12 | 0x1x0x | 0xx0xx | 0xxx0xxx |
| 13 | 0x1x0x | 0xx0xx | 0xxx0xxx |
| 14 | 0x1x0x | 0xx0xx | 1xxx |
| 15 | 0x0x | 0xx0xx | 1xxx |
| 16 | 0x0x | 1xx | 1xxx |
| 17 | 1x | 1xx | 1xxx |
| 18 | 1x | 1xx | 1xxx |
| 19 | 0x0x | 1xx | 1xxx |
| 20 | 0x0x | 0xx0xx | 1xxx |
| 21 | 0x1x0x | 0xx0xx | 1xxx |
| 22 | 0x1x0x | 0xx0xx | 0xxx0xxx |
| 23 | 0x1x0x | 0xx0xx | 0xxx0xxx |
| 24 | 0x1x0x | 0xx0xx | 0xxx0xxx |
| 25 | 0x1x1x0x | 0xx0xx | 0xxx0xxx |
| 26 | 0x1x1x0x | 0xx0xx | 0xxx0xxx |
| 27 | 0x1x1x0x | 0xx0xx | 0xxx0xxx |
| 28 | 0x1x1x0x | 0xx1xx0xx | 0xxx0xxx |
| 29 | 0x1x1x0x | 0xx1xx0xx | 0xxx0xxx |
| 30 | 0x1x1x0x | 0xx1xx0xx | 0xxx0xxx |
| 31 | 0x1x1x0x | 0xx1xx0xx | 0xxx0xxx |
| 32 | 0x1x1x0x | 0xx1xx0xx | 0xxx0xxx |
| 33 | 0x1x1x1x0x | 0xx1xx0xx | 0xxx0xxx |
| 34 | 0x1x1x1x0x | 0xx1xx0xx | 0xxx0xxx |
| 35 | 0x1x1x1x0x | 0xx1xx0xx | 0xxx0xxx |

In selecting code words to be used for a particular application, one is not restricted to using up all of the code words for a given class before selecting additional code words from a higher class. For example, assume that a source is provided that has 205 symbols and a known pdf. Starting, first, with an lmin2 code type, one examines the column labeled "Accumulated no. of words" in Table 2, and locates a row showing a number greater than or equal to 205. In this case, this is the row showing 254 as the accumulated number of words. The table also shows that there is a maximum of two words belonging to class 1, four words belonging to class 2, eight words belonging to class 3, sixteen words belonging to class 4, thirty-two words belonging to class 5 and sixty-four words belonging to class 6. Thus, classes 1 through 6 together contain a total of 126 words. Because it is unnecessary, in this example, to have 254 words, only 205-126=79 words need to be selected from class 7. Hence, there is a freedom to choose the 79 code words from among the 128 available code words in class 7. This type of freedom can also be used to decrease the number of code words in any of the lower classes. No more than 128-79=49 code words can be moved in this way.

The same procedure can be applied to code types lmin3 and lmin4. When the number of code words in each class and for each code type have been determined, one can then use equation (2) to see which type gives the smallest average word length, and this type may then be selected.

When the type of code and the number of code words within each class are selected one can then calculate the pdf for the MC. This pdf may be used in the decoder to judge the probability of receiving the different MC words, as will be described in greater detail below.

Decoder

The decoder should be provided with the following information prior to beginning the decoding process:

for the CC, the code table and type of code being received, (e.g., lmin2, lmin3 or lmin4)

knowledge of which MC word(s) are invalid knowledge of which code words in each class are invalid knowledge of which code word represents an end-of-block.

The following additional information may also be useful for the decoder:

pdf for the MC words number of code words in a received block, or alternatively the maximum number of code words in a received block The decoder is synchronized from the beginning. This may be accomplished by having the transmitter send a particular start code (once or repeatedly) to signal the beginning of the information transfer.

After a block of code words has been received, the MC is extracted from the CC and dealt with separately. This is done by selecting, from the received bit stream, each second, third, or fourth bit depending on the type of code being used (e.g., any of code types lmin2, lmin3 or lmin4, illustrated in Table 3).

Figure 2:
FIG. 2 is an example of decoding an encoded bit stream in accordance with the invention.

FIG. 2 shows an example of an MC word sequence 205 that has been extracted from an lmin3 type code bit stream. The original encoded sequence 201 of MC words had twelve symbols as shown, but a bit error 203 has been introduced during transmission on the channel, so that the code word 010 has erroneously been received as the code word 110.

In accordance with this aspect of the invention, the received sequence 205 is first decoded in the forward direction (i.e., from left to right) 207 until an invalid MC word is detected, which in this case is 011. It will be observed that the erroneous bit (i.e., the bit that was received as a "1" instead of the intended "0") was not detected as being in error, but has instead been interpreted as the valid one-bit long code word "1". This causes further forward decoding to be out of synchronization with the intended grouping of bits.

As soon as an invalid code word is detected (i.e., the 011 in this example), its location in the bit sequence is noted, and backward decoding (i.e., from right to left) 209 begins at the end of the block, and continues until either an invalid MC word is detected or the beginning of the sequence is reached, whichever occurs first. In the present example, the invalid MC word 110 is detected. The bit error is then known to be localized to the interval 211 between the leftmost '1' of the backward decoded 110 and the rightmost '1' in the forward decoded 011. The decoded symbols lying outside of the interval 211 are considered to be valid, and include symbols decoded in the forward direction as well as some that were decoded in the backwards direction. The resultant decoded symbols 213 in this example comprise eight of the original 12 MC words. Since each of these eight MC words indicates the size of its associated IC, the IC words can then be decoded.

In the above example, it was stated that backward decoding begins at the end of the block and works its way to the front of the block. This is possible alternatively if the number of code words in the block is known, or if an end-of-block word is known and has been received error-free.

However, if there is no information that enables the decoder to locate the end of a block, the code word sequence can be estimated. Continuing with the above example, the question is then, what single-bit error is most likely to have generated the non-valid MC word 011? Denoting the probabilities for the classes 1, 2 and 3 as p1, p2 and p3, respectively, and denoting the bit error rate of the BSC channel as $P_e$, we have:

1,1,1 → 011 with probability $P1 \cdot P1 \cdot P1 \cdot P_e \cdot (1-P_e)^2$ 00,1 → 011 with probability $p2 \cdot P1 \cdot P_e \cdot (1-P_e)^2$ 010 → 011 with probability $P3 \cdot P_e \cdot (1-P_e)^2$ and the sequence with the highest probability is Note that this figure is not dependent on the bit error rate $P_e$.

For Laplacian and Gaussian distributions, the sequence 00,1 is normally the most likely combination to have caused 011, and therefore consists of two MC code words. This is also consistent with a second example to be described below with reference to FIG. 3.

The following additional information can be used by the decoder to avoid loosing synchronization and to decrease the interval of possible bit errors:

probability of a particular Class occurrence, calculated from the pdf and the Class partitioning. This is the same as the probability of occurrence of a particular MC word.

detection of non-valid CC words, i.e., not all possible code words in the FLCs are used.

Techniques for using this additional information will be described in greater detail below.

A second example will now be described with reference to FIG. 3. In this example, the Code type is lmin4, and an invalid MC word is 0111. An encoded sequence 301 that has fifteen symbols is shown. During transmission, a bit error 303 occurs so that a transmitted "0" is received as a "1" in the received sequence 305.

Forward decoding 307 is performed until an invalid code word 0111 is encountered. (Had the bit error 303 not occurred, this invalid code word would have been correctly decoded as the three code words "00", "1" and "1".) The location of the invalid code word is saved, and backward decoding 309 is initiated, starting from the end of the block and working its way to the front. Backward decoding 309 progresses until an invalid code word 1110 is encountered. The location of this invalid code word is saved, and the erroneous region 311 is identified as being those bits lying in the interval between the two saved invalid code words.

The decoded symbols lying outside of the interval 311 are considered to be valid, and include symbols decoded in the forward direction as well as some that were decoded in the backwards direction. The resultant decoded symbols 313 in this example comprise eight of the original 12 MC words. Since each of these eight MC words indicates the size of its associated IC, the IC words can then be decoded.

Figure 4:
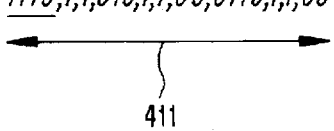
FIG. 4 is yet another example of decoding an encoded bit stream in accordance with the invention.

When longer MC words are used, due to large code tables, it may take some time before a bit error is detected. This is illustrated in a third example, which will now be described with reference to FIG. 4. Here, the Code type is again lmin4, and an invalid MC word is 0111. An encoded sequence 401 that has fifteen symbols is shown. During transmission, a bit error 403 occurs so that a transmitted "0" is received as a "1" in the received sequence 405 as shown.

Forward decoding 407 is performed. Unlike the previous example, the received sequence 405 includes only valid code words, despite the presence of the bit error. Only when the end of the block is reached is it detected that an error occurred. This detection is made on the basis of finding an incomplete code word (i.e., a single-bit "0") as the last item in the block. The location of the invalid code word is saved, and backward decoding 409 is initiated, starting from the end of the block and working its way to the front. Backward decoding 409 progresses until an invalid code word 1110 is encountered. The location of this invalid code word is saved, and the erroneous region 411 is identified as being those bits lying in the interval between the two saved invalid code words.

The decoded symbols lying outside of the interval 411 are considered to be valid, and in this case include only those symbols decoded in the forward direction, because forward processing did not detect the first invalid MC until the end of the block was encountered. The resulting decoded sequence 415 contains only three of the original fifteen MC code words. The three IC words associated with these three MC code words can then be decoded (not shown).

A complete example will now be described with reference to Table 4, which shows a Huffman code table that may be used, for example, as a motion vector data (MVD) table.

TABLE 4

| Index | Codes |
|---|---|
| 0 | 0000 0000 0010 1 |
| 1 | 0000 0000 0011 1 |
| 2 | 0000 0000 0101 |
| 3 | 0000 0000 0111 |
| 4 | 0000 0000 1001 |
| 5 | 0000 0000 1011 |
| 6 | 0000 0000 1101 |
| 7 | 0000 0000 1111 |
| 8 | 0000 0001 001 |
| 9 | 0000 0001 011 |
| 10 | 0000 0001 101 |
| 11 | 0000 0001 111 |
| 12 | 0000 0010 001 |
| 13 | 0000 0010 011 |
| 14 | 0000 0010 101 |
| 15 | 0000 0010 111 |
| 16 | 0000 0011 001 |
| 17 | 0000 0011 011 |
| 18 | 0000 0011 101 |
| 19 | 0000 0011 111 |
| 20 | 0000 0100 001 |
| 21 | 0000 0100 011 |
| 22 | 0000 0100 11 |
| 23 | 0000 0101 01 |
| 24 | 0000 0101 11 |
| 25 | 0000 0111 |
| 26 | 0000 1001 |
| 27 | 0000 1011 |
| 28 | 0000 111 |
| 29 | 0001 1 |
| 30 | 0011 |
| 31 | 011 |
| 32 | 1 |
| 33 | 010 |
| 34 | 0010 |
| 35 | 0001 0 |
| 36 | 0000 110 |
| 37 | 0000 1010 |
| 38 | 0000 1000 |
| 39 | 0000 0110 |
| 40 | 0000 0101 10 |
| 41 | 0000 0101 00 |
| 42 | 0000 0100 10 |
| 43 | 0000 0100 010 |
| 44 | 0000 0100 000 |
| 45 | 0000 0011 110 |
| 46 | 0000 0011 100 |
| 47 | 0000 0011 010 |
| 48 | 0000 0011 000 |
| 49 | 0000 0010 110 |
| 50 | 0000 0010 100 |
| 51 | 0000 0010 010 |

TABLE 4-continued

| Index | Codes |
|---|---|
| 52 | 0000 0010 000 |
| 53 | 0000 0001 110 |
| 54 | 0000 0001 100 |
| 55 | 0000 0001 010 |
| 56 | 0000 0001 000 |
| 57 | 0000 0000 1110 |
| 58 | 0000 0000 1100 |
| 59 | 0000 0000 1010 |
| 60 | 0000 0000 1000 |
| 61 | 0000 0000 0110 |
| 62 | 0000 0000 0100 |
| 63 | 0000 0000 0011 0 |

Because the table illustrates a Huffman code, we can calculate the probability distribution for the source as $p_c(k)=2^{-l(k)}$, $0 \leq k \leq N-1$. The word length distribution $l(k)$ is close to 1 in the Kraft inequality, equation (3), and therefore the code is optimum, that is, the average word length is equal to the entropy of the source for the stated pdf. The entropy and the average word length is about 2.61 bits/symbol for this source.

The average word length for the lmin3 code shown in Table 5 (see below) is 3.62 bits/symbol for the same pdf and the redundancy is about 28%, where redundancy is defined as:

$$\text{Redundancy} = 1 - \frac{H_A}{l_{mean}}$$

where $H_A$ is the entropy of a source, A (see equation (1)) On the other hand, for a Laplacian probability distribution of the source with standard deviation $\sigma=4$, the average word length for both codes is about 4.58 bits/symbol and a redundancy of about 14%. For $\sigma=5$, the lmin3 code, with average word lengths 4.90 and 5.16 bits/symbol and redundancies 13% and 18%, respectively, is more efficient than the code shown in Table 4.

Thus, the code that is most effective depends critically on the actual pdf.

Table 5 shows a lmin3 code, with 4 code words in class 1 and MC=1 with probability p1;

15 code words in class 2 with MC=00 with probability p2;

45 code words in class 3 with MC=010 with probability p3; and invalid MC=011.

In Table 5, two Baang-2 codes are used for 4 and 6 bit ICs and one Baang-1 (Gray) code for 2 bit ICs.

TABLE 5

| Index | Bit number | Marker Code (MC) | Info Code (IC) | Channel Code (CC) |
|---|---|---|---|---|
| 0 | 9 | 010 | 010100 | 001 101 000 |
| 1 | 9 | 010 | 001001 | 000 110 001 |
| 2 | 9 | 010 | 000011 | 000 100 011 |
| 3 | 9 | 010 | 000101 | 000 101 001 |
| 4 | 9 | 010 | 001010 | 000 110 010 |
| 5 | 9 | 010 | 001100 | 000 111 000 |
| 6 | 9 | 010 | 000110 | 000 101 010 |
| 7 | 9 | 010 | 011001 | 001 110 001 |
| 8 | 9 | 010 | 010011 | 001 100 011 |
| 9 | 9 | 010 | 010101 | 001 101 001 |
| 10 | 9 | 010 | 011010 | 001 110 010 |
| 11 | 9 | 010 | 011100 | 001 111 000 |
| 12 | 9 | 010 | 010110 | 001 101 010 |
| 13 | 9 | 010 | 001011 | 000 110 011 |
| 14 | 9 | 010 | 001101 | 000 111 001 |
| 15 | 9 | 010 | 000111 | 000 101 011 |
| 16 | 9 | 010 | 001110 | 000 111 010 |
| 17 | 9 | 010 | 011011 | 001 110 011 |
| 18 | 9 | 010 | 011101 | 001 111 001 |
| 19 | 9 | 010 | 010111 | 001 101 011 |
| 20 | 9 | 010 | 011110 | 001 111 010 |
| 21 | 9 | 010 | 001111 | 000 111 011 |
| 22 | 9 | 010 | 011111 | 000 100 000 |
| 23 | 6 | 00 | 0100 | 001 000 |
| 24 | 6 | 00 | 0010 | 000 010 |
| 25 | 6 | 00 | 0001 | 000 001 |
| 26 | 6 | 00 | 0110 | 001 010 |
| 27 | 6 | 00 | 0101 | 001 001 |
| 28 | 6 | 00 | 0011 | 000 011 |
| 29 | 6 | 00 | 0111 | 001 011 |
| 30 | 3 | 1 | 00 | 100 |
| 31 | 3 | 1 | 10 | 110 |
| 32 | 3 | 1 | 11 | 111 |
| 33 | 3 | 1 | 01 | 101 |
| 34 | 6 | 00 | 1111 | 011 011 |
| 35 | 6 | 00 | 1011 | 010 011 |
| 36 | 6 | 00 | 1101 | 011 001 |
| 37 | 6 | 00 | 1110 | 011 010 |
| 38 | 6 | 00 | 1001 | 010 001 |
| 39 | 6 | 00 | 1010 | 010 010 |
| 40 | 6 | 00 | 1100 | 011 000 |
| 41 | 6 | 00 | 1000 | 010 000 |
| 42 | 9 | 010 | 111111 | 011 111 011 |
| 43 | 9 | 010 | 101111 | 010 111 011 |
| 44 | 9 | 010 | 111110 | 011 111 010 |
| 45 | 9 | 010 | 110111 | 011 101 011 |
| 46 | 9 | 010 | 111101 | 011 111 001 |
| 47 | 9 | 010 | 111011 | 011 110 011 |
| 48 | 9 | 010 | 101110 | 010 111 010 |
| 49 | 9 | 010 | 100111 | 010 101 011 |
| 50 | 9 | 010 | 101101 | 010 111 001 |
| 51 | 9 | 010 | 101011 | 010 110 011 |
| 52 | 9 | 010 | 110110 | 011 101 010 |
| 53 | 9 | 010 | 111100 | 011 111 000 |
| 54 | 9 | 010 | 111010 | 011 110 010 |
| 55 | 9 | 010 | 110101 | 011 101 001 |
| 56 | 9 | 010 | 110011 | 011 100 011 |
| 57 | 9 | 010 | 111001 | 011 110 001 |
| 58 | 9 | 010 | 100110 | 010 101 010 |
| 59 | 9 | 010 | 101100 | 010 111 000 |
| 60 | 9 | 010 | 101010 | 010 110 010 |
| 61 | 9 | 010 | 100101 | 010 101 001 |
| 62 | 9 | 010 | 100011 | 010 100 011 |
| 63 | 9 | 010 | 101001 | 010 110 001 |

Denoting the pdf for the source as $p_c(k)$ the corresponding probabilities for the different MCs (classes) are:

$$p1 = \sum_{k=30}^{33} p_c(k) \qquad (4)$$

$$p2 = \sum_{k=23}^{29} p_c(k) + \sum_{k=34}^{41} p_c(k)$$

$$p3 = \sum_{k=0}^{22} p_c(k) + \sum_{k=42}^{63} p_c(k)$$

Table 6 shows these probabilities for 3 different pdf's, where $L(m,\sigma)$ denotes a Laplacian distribution with mean and standard deviation $\sigma$, and $N(m,\sigma)$ denotes a Gaussian distribution with mean m and standard deviation $\sigma$.

TABLE 6

| pdf | p1 | p2 | p3 |
| --- | --- | --- | --- |
| Table 4 code | 0.8130 | 0.1681 | 0.0189 |
| L(32,4) | 0.5069 | 0.4588 | 0.0342 |
| N(32,4) | 0.3811 | 0.6017 | 0.0173 |

Although the figures vary for different distributions, the class 3 probability is always about an order less than the others. This additional information can be used in the decoding process to detect and confine bit errors to smaller regions. In this example, an unduly high count of '010' relative to the counts of '1' and '00' may indicate a bit error (or loss of synchronization) and this may happen before the non-valid MC 011 is encountered.

Moreover, since the ICs in class 3 only use 45 code words of 64 possible, there are nineteen invalid code words in this class that can be used to detect bit errors. The IC in each class is a fixed length code (FLC). As previously mentioned, any FLC design technique may be used (straight binary code, Gray code, etc.), but in an error prone environment it is advantageous to use an error resilient code such as the Baang-1 or the Baang-2 codes described in U.S. Provisional Application No. 60/007,614, which was incorporated by reference in its entirety.

A basic encoding scheme in accordance with one aspect of the invention will now be described with reference to the flow chart depicted in FIG. 5. A block of code words is received and stored in the decoder as a concatenated stream of bits (step 501). The decoding scheme continues by initializing two variables, an MC forward Counter (MC_f Counter) and an MC backward Counter (MC_b Counter) so that they point to the start and end, respectively, of the received block (step 503).

Forward decoding (e.g., from left to right) now begins. Depending on the type of VLC code being decoded (e.g., lmin2, lmin3 or lmin4), every $n^{th}$ bit (e.g., every second, third or fourth bit) in the stored bit stream is extracted (step 505). The extracted bit stream forms the sequence of bits that represents the next received MC. The bits that have not been extracted are the IC bits that need to be decoded.

After extracting an MC word, the MC_f Counter is incremented by the number of bits in the MC word (step 507), and a check is performed to see whether or not it is valid (decision block 509). The full MC is a compact VLC (i.e., it satisfies equation (3) with equal sign). There is at least one invalid MC word. For example, if an lmin3 code is being decoded, valid MC words may be 1,00 or 010 with the MC word 011 being invalid. (See also Table 1 for other examples). Note that if the decoder reaches the end of the block and at that moment does not have a valid MC word, for example 0 or 01 in the previous example, this is interpreted as an invalid MC word.

If the detected MC word is valid ("Yes" path out of decision block 509), then the bits that were not extracted, that is the corresponding IC words, can now be decoded. The number of corresponding IC bits for each MC word is determined from the MC word itself (e.g., for code type lmin3, there are two IC bits for every one bit in the MC word), and those bits are extracted from the stored bit stream (see, e.g., Table 3 to see how the location of the IC bits relates to the placement of the MC bits in the received bit stream) (step 511).

Each extracted IC should have one of the values in a predefined fixed length code table, and for a given number of bits, n, there is a maximum of $2^n$ IC words. Not all of these words need to be used, and in particular for the class corresponding to the longest MC word there may be IC words that are not used. See for example Table 4, where there are nineteen non-used IC words in class 3.

Each extracted IC word is tested to see whether it is a valid IC word, that is, whether the extracted IC word matches one of the values in the corresponding FLC table (decision block 513). For each IC word that is invalid, ("No" path out of decision block 513), one can choose either to skip the IC word ("No" path out of decision block 515) or else one can try to estimate a valid IC word ("Yes" path out of decision block 515). Estimating each invalid IC (step 517) involves selecting a valid IC word that in some sense, for example Hamming distance, is close to the detected word.

A reason why one might want to dynamically make the decision to skip or estimate a valid IC word, rather than always skipping or always estimating, is that the Hamming distance of a decoded IC word may make it relatively simple or alternatively difficult to perform the estimation. For example, a decoded IC word may have a Hamming distance of 1 to one valid code word, in which case the choice of which word to select is simple. At another point in time, a decoded IC word may have a Hamming distance of 2 to three valid code words, in which case the choice for the estimation is not so apparent.

Whether or not the extracted IC word is valid, and whether or not an invalid IC word has been skipped or estimated, processing continues by testing the MC_f Counter to see whether the End-of-Block (EoB) has been reached (decision block 519). If not ("No" path out of decision block 519), then the processing loop is repeated, beginning at step 505.

However, if the End-of-Block has been reached ("Yes" path out of decision block 519), then it is the case that only valid MC words have been detected in the received block, although it is possible that one or more IC words may have been skipped or estimated. All of the "valid" IC words (including estimated IC words) are then output from the routine (step 521). Alternatively, corresponding indices of the IC words within the block may be output. Processing is then complete (step 523).

Returning now to decision block 509, if the detected MC word is not valid ("No" path out of decision block 509), then the value of the MC_f Counter is stored (step 525), and backward decoding (e.g., decoding from right to left within the received block) begins. Working backwards, an MC word is extracted (step 527), and the MC_b Counter is decremented by the number of bits in the extracted MC word (step 529).

If the extracted MC word is valid ("Yes" path out of decision block 531), then the bits that were not extracted, that is the corresponding IC word, can now be decoded, so the number of corresponding IC bits for the extracted MC word are extracted from the stored bit stream (step 533).

Each extracted IC word is tested to see whether it is a valid IC word, that is, whether the extracted IC word matches one of the values in the corresponding FLC table (decision block 535). For each IC word that is invalid, ("No" path out of decision block 535), one can choose either to skip the IC word ("No" path out of decision block 537) or else one can try to estimate a valid IC word ("Yes" path out of decision block 539). As indicated above, estimating each invalid IC (step 539) involves selecting a valid IC word that in some sense, for example Hamming distance, is close to the detected word.

Whether or not the extracted IC word is valid, and whether or not an invalid IC word has been skipped or estimated, processing continues by testing the MC_b Counter to see whether the Start-of-Block (SoB) has been reached (decision block 541). If not ("No" path out of decision block 541), then the processing loop is repeated, beginning at step 527.

However, if the Start-of-Block has been reached ("Yes" path out of decision block 541), then it is the case that only supposedly valid MC words have been detected in the received block during backwards processing. Because it is known, from forward processing, that an error exists, none of the MC words that lie between the Start-of-Block and the MC_f Counter can be considered to be valid, and only those MC words that come after (i.e., to the right of) the erroneous MC word discovered during forward processing will be used to identify valid IC words. Accordingly, the value of the MC_b Counter is stored (step 543), and only the valid IC words (including any "estimated" IC words) are output from the routine (step 545). Alternatively, corresponding indices of the IC words within the block may be output. Processing is then complete (step 547).

Returning now to decision block 531, if an invalid MC word is extracted ("No" path out of decision block 531), then the location of the error has been localized to the region in the received block lying between the MC_b Counter and the MC_f Counter. Accordingly, the value of the MC_b Counter is stored (step 543), and only the valid IC words (including any "estimated IC words) are output. In this case, this means outputting valid IC words that were decoded during forward processing (i.e., those valid IC words lying between the Start-of-Block and the MC_b Counter) as well as outputting valid IC words that were decoded during backwards processing (i.e., those valid IC words lying between the MC_f Counter and the End-of-Block). Processing is then complete (step 547).

Figure 5:
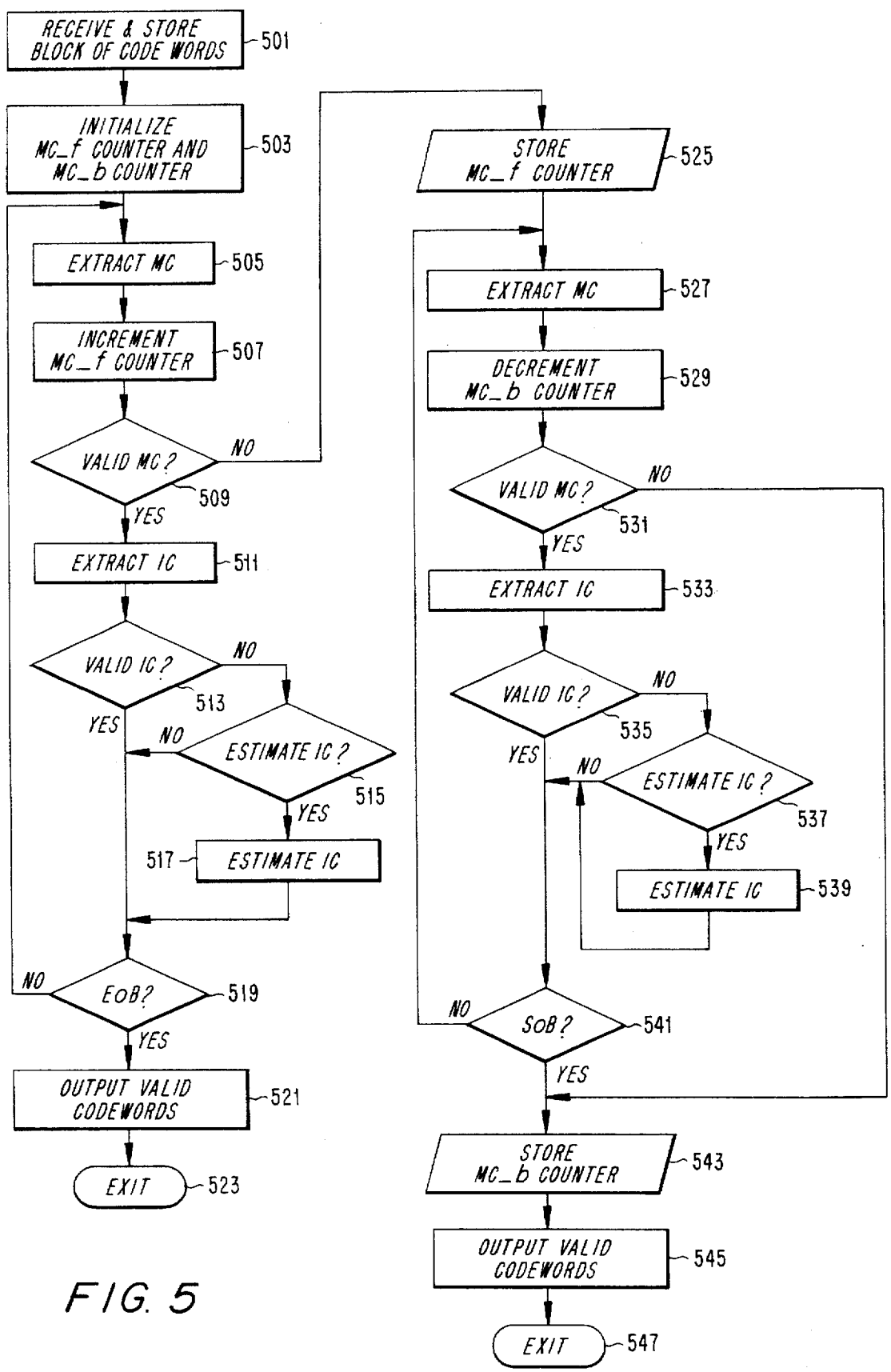
FIG. 5 is a flowchart of a decoding scheme in accordance with one embodiment of the invention.
Figure 6:
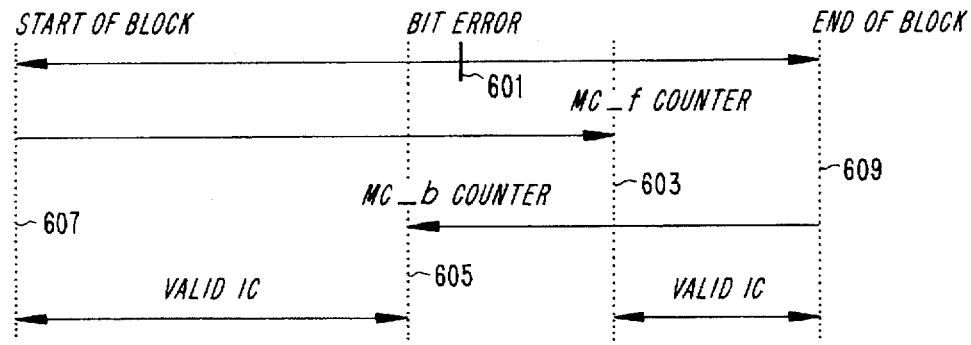
FIG. 6 is a diagram illustrating the characteristic behavior of a decoding scheme in accordance with one embodiment of the invention.

The basic encoding scheme illustrated in FIG. 5 has characteristic behavior as illustrated in FIG. 6 for the case where only one error is detected in the received block. Given the existence of a bit error 601 in the received block, the forward decoding may not detect an invalid MC until sometime later, denoted by the location of the MC_f Counter 603. Backwards decoding then begins, and may not discover an invalid MC word until a location that precedes the actual location of the bit error 601. The location of the detected invalid MC word is denoted by the location of the MC_b Counter 605. During the output phase, the valid ICs are those lying in the interval from the Start-of-Block 607 up to the MC_b counter 605, and also those lying in the interval starting from and including the MC_f Counter 603 up to the End-of-Block 609.

Figure 7:
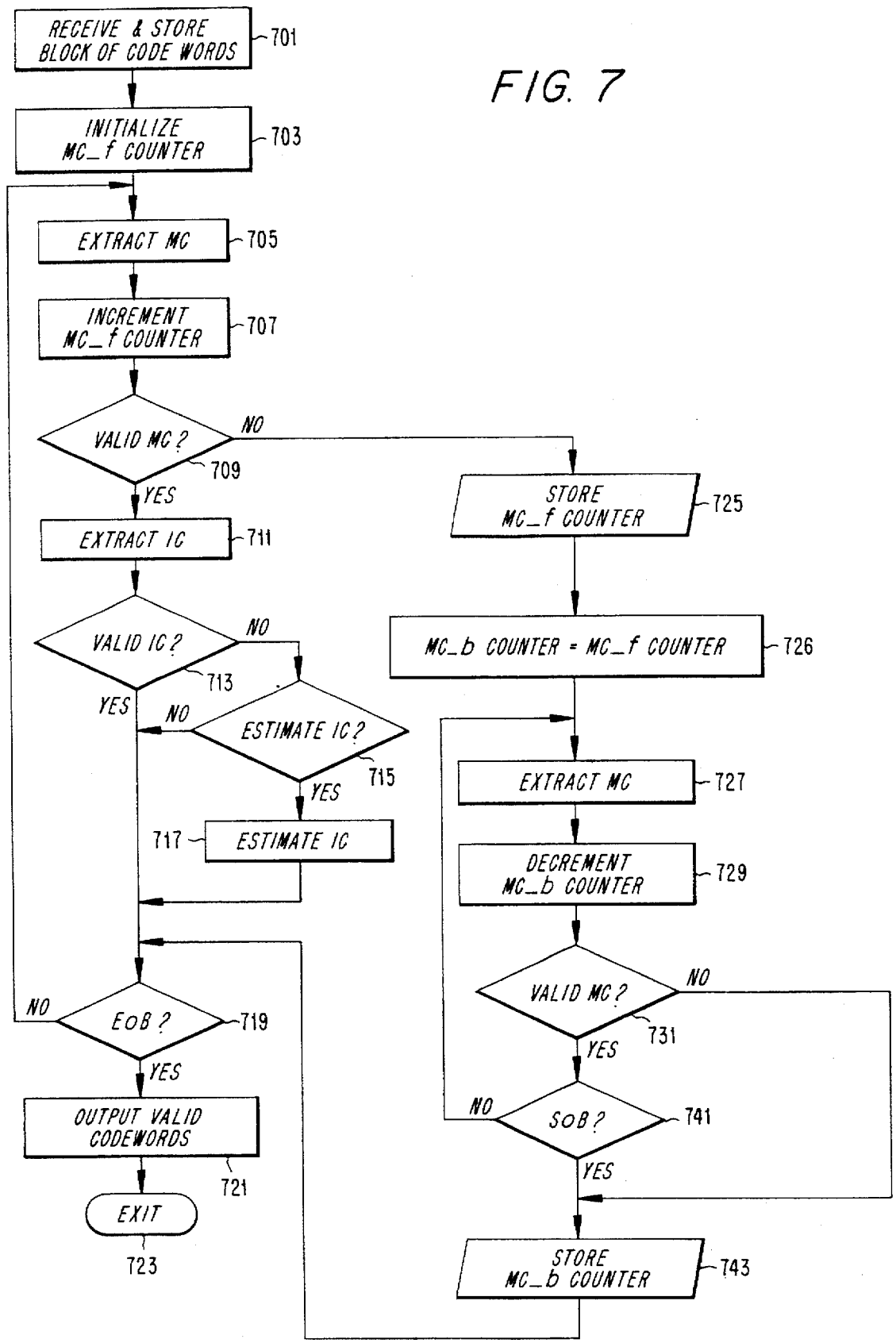
FIG. 7 is a flowchart of a decoding scheme in accordance with an alternative embodiment of the invention.

An alternative decoding scheme is shown in FIG. 7. In this embodiment of the invention, the decoder can confine the bit errors to smaller intervals by reversing the decoding when a bit error is detected in the forward direction and starting the backward decoding from that position. After the bit error has been detected in the backwards direction, the forward decoding continues from the next bit position just after the point where the previous forward error was detected. That is, forward processing resumes from the last location pointed to by the MC_f Counter. It will be observed that in this embodiment, valid IC words are generated only during the forward processing, because the backwards processing serves only to identify the start of the invalid interval. Except for these differences, steps 701–731 and 741–743 are analogous to steps 501–531 and 541–543 described above with respect to FIG. 5, and will therefore not be described here in great detail. After storing a value of the MC_b Counter in step 743, forward processing is resumed at decision block 719 to test whether the End-of-Block has been reached. It is noted that if multiple errors are detected, there will be multiple sets of stored MC_f Counter and MC_b Counter values. Consequently, outputting valid codewords (step 721) consists of outputting valid IC words corresponding to the localized intervals that have been determined to be error-free. The localized intervals would be a first interval lying between the Start-of-Block and a first stored MC_b Counter, a second estimated interval lying between a first stored MC_f Counter and a second stored MC_b Counter, and so on until a final interval lying between a last-stored MC_f Counter and the End-of-Block.

It can be seen from the above that the invention is capable of extracting valid IC words from a received data block despite the presence of multiple bit errors. It is further noted that the number of IC words that have been lost in the invalid intervals is unknown, but that this number can be estimated.

Figure 8:
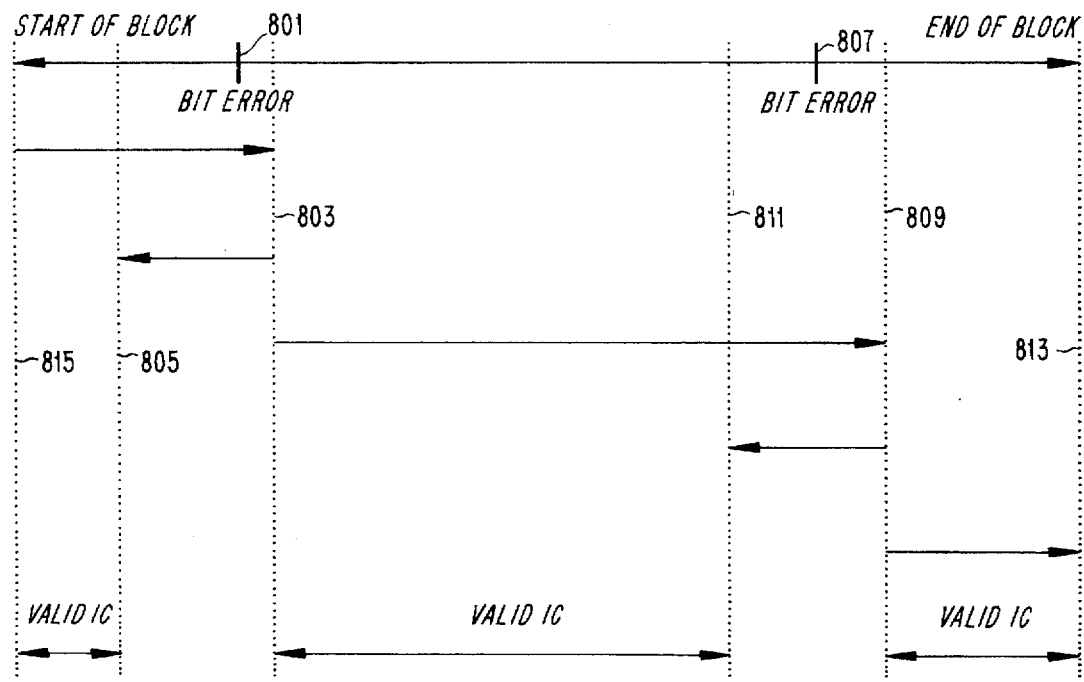
FIG. 8 is a diagram illustrating the characteristic behavior of a decoding scheme in accordance with an alternative embodiment of the invention.

The alternative encoding scheme illustrated in FIG. 7 has characteristic behavior as illustrated in FIG. 8 for the case where two errors are detected in the received block. Given the existence of a first bit error 801 in the received block, the forward decoding may not detect an invalid MC until sometime later, denoted by the location of the first MC_f Counter value 803. Backwards decoding then begins at this point, and may not discover an invalid MC word until a location that precedes the actual location of the bit error 801. The location of the detected invalid MC word is denoted by the location of the first MC_b Counter value 805.

Forward decoding then resumes from the bit position just after the point where it last left off, here designated by the first MC_f Counter value 803. A second bit error 807 also exists in the received block, but the forward decoding may not detect an invalid MC until sometime later, denoted by the location of the second MC_f Counter value 809. Backwards decoding then begins at this point, and may not discover an invalid MC word until a location that precedes the actual location of the second bit error 807. The location of the detected invalid MC word is denoted by the location of the second MC_b Counter value 811.

Forward processing again resumes from the bit position just after the point where it left off, that is at the place denoted by the second MC_f Counter value 809. Because there are no more errors in the received block, processing continues until the End-of-Block 813 is detected, at which point the valid ICs are output. The valid ICs are those lying in a first interval defined by the Start-of-Block 81S up to a first MC_b Counter value 805, a second interval defined by the first MC_f Counter value 803 and a second MC_b Counter value 811, and also those lying in a third interval starting from and including a second MC_f Counter 809 up to the End-of-Block 813.

Figure 9:
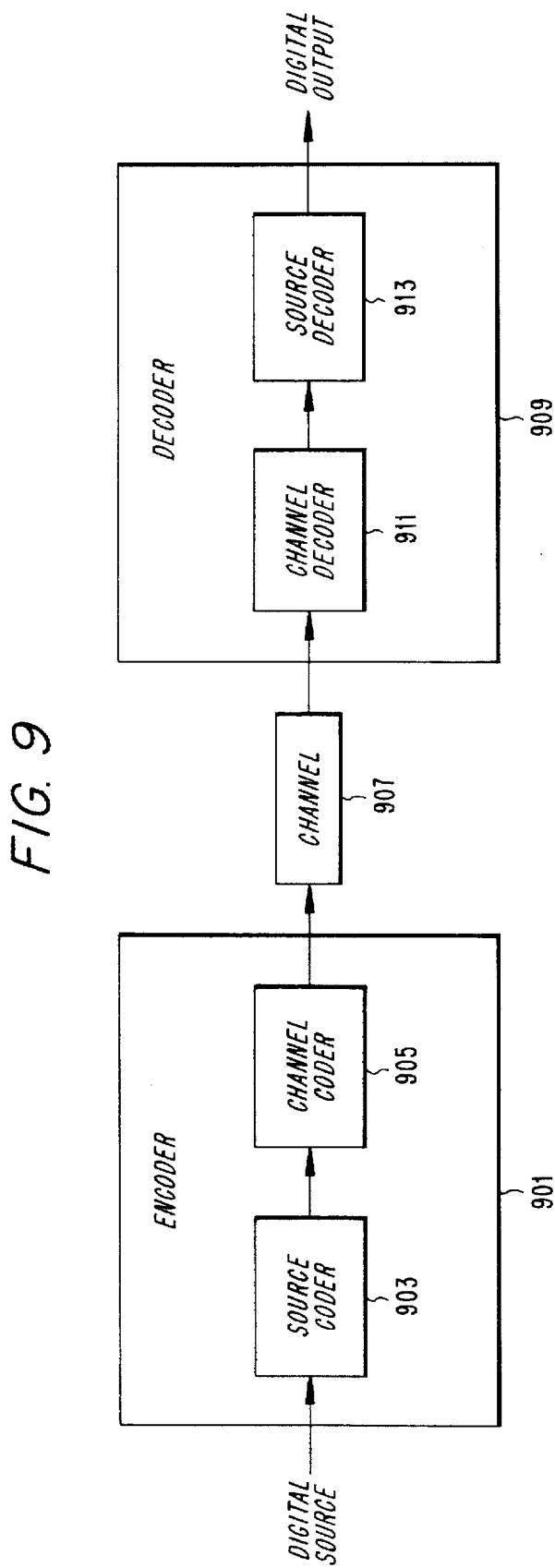
FIG. 9 is a block diagram of a system incorporating the various aspects of the invention.

The invention may be embodied in many forms, including hardwired digital logic, or alternatively programmed processors. A high-level block diagram of a system employing the inventive concepts is shown in FIG. 9. On the transmitting side, an encoder 901 comprises a source coder 903 and a channel coder 905. The source coder receives digitally encoded source symbols, and outputs corresponding IC words, which are supplied to the channel coder 905. The channel coder 905 generates an appropriate MC word in accordance with the principles described above, and generates a CC word by inserting the MC bits at predetermined fixed intervals into the IC words. The channel coder 905 then supplies the generated CC word to the channel 907.

On the receiving side, a decoder 909 comprises a channel decoder 911 and a source decoder 913 which coordinate their operations to perform the steps illustrated, for example, in either of FIGS. 5 or 7. The channel decoder 911 receives a block of CC words from the channel 907, and extracts bits at predetermined fixed intervals. It then decodes the MC words and uses these to generate a corresponding set of "valid" (possibly estimated) IC words in accordance with the techniques described in detail above. The IC words are then supplied to the source decoder 913, which translates the IC words into the corresponding digital source symbols, which are then output from the decoder 909.

The invention is characterized by a number of merits including:

It is simple to encode;

It is simple to decode;

It is efficient, requiring relatively low redundancy in the transmitted bits;

It exhibits a relatively low amount of encoding/decoding delay, especially when the alternative embodiment is employed in which backwards decoding begins at the point where forward decoding first detects a bit error, rather than from the End of Block;

It does not require that a backward channel be provided; and

It is self-synchronizing.

The invention has been described with reference to a particular embodiment. However, it will be readily apparent to those skilled in the art that it is possible to embody the invention in specific forms other than those of the preferred embodiment described above. This may be done without departing from the spirit of the invention. For example, the role of 0's and 1's can be swapped compared to the illustrated examples, and the position of the MC bits in the channel code word can be changed.

Thus, the preferred embodiment is merely illustrative and should not be considered restrictive in any way. The scope of the invention is given by the appended claims, rather than the preceding description, and all variations and equivalents which fall within the range of the claims are intended to be embraced therein.

What is claimed is:

1. A method for transmitting data over a channel in a telecommunications system, the method comprising the steps of:

providing a plurality of fixed length code tables, wherein each of the fixed length code tables has a size that is different from a size of every other fixed length code table;

encoding the data as a plurality of information code words, wherein each information code word is a selected value from one of the fixed length code tables;

providing a plurality of marker codes, wherein the marker codes are variable length codes;

associating a unique one of the marker codes with each of the fixed length code tables;

generating channel code words by inserting the associated marker code one bit at a time into each of the information code words at a fixed bit interval; and transmitting the channel code words over the channel.

2. The method of claim 1, wherein:

the plurality of marker codes is a compact short variable length code that satisfies the relationship:

$$\sum_{k=0}^{M-1} 2^{-l(k)} \leq 1$$

where k is an index that designates one of the marker codes, l(k) is the length of the marker code designated by the index k, and N is the number of marker codes; and at least one of the marker codes is designated as an invalid marker code that is not to be associated with any of the fixed length code tables.

3. The method of claim 2, wherein the step of associating a unique one of the marker codes with each of the fixed length code tables comprises the steps of:

associating a shortest marker code with a shortest fixed length code table; and associating increasingly longer marker codes with increasingly longer fixed length code tables.

4. The method of claim 3, wherein:

for each symbol of data there is a corresponding information code word selected from one of the fixed length code tables; and at least one of the fixed length code tables includes one or more values that were selected for use as information code words, and one or more remaining values that were not selected for use as information code words.

5. A method for receiving data from a channel in a telecommunications system, the method comprising the steps of:

receiving a block of data bits from the channel, wherein the block of data bits has a first end designated as a start of block, and a second end designated as an end of block;

starting at the start of block, processing the block of data bits in a forward direction by extracting every n+1 bits, where n is an integer greater than or equal to 1, wherein the extracted bits are designated extracted marker code bits;

determining whether the extracted marker code bits constitute a valid one of a plurality of marker code words, wherein the marker codes are variable length codes;

if the extracted marker code bits constitute a valid one of the plurality of marker code words, then for every one of the marker code word bits, extracting n previously not extracted bits from the block of data bits for use as a received information code word;

determining whether the received information code word is a valid member of a fixed length code table; and if the received information code word is a valid member of the fixed length code table, then storing the received information code word for subsequent processing.

6. The method of claim 5, further comprising the steps of:

estimating a valid information code word from the received information code word if the received information code word is not a valid member of the fixed length code table; and storing the estimated information code word for subsequent processing.

7. The method of claim 6, wherein the step of estimating the valid information code word comprises estimating an information code word that has a closest Hamming distance from the received information code word.

8. The method of claim 5, further comprising the steps of:

if the extracted marker code bits do not constitute a valid one of the plurality of marker code words, then storing a position of the forward extracted marker code bits and starting at the end of block, processing the block of data bits in a backwards direction by extracting every n+1 bits, where n is an integer greater than or equal to 1, the backwards extracted bits being designated backwards extracted marker code bits;

determining whether the backwards extracted marker code bits constitute a valid one of the plurality of marker code words;

if the backwards extracted marker code bits constitute a valid one of the plurality of marker code words, then for every one of the marker code word bits, extracting n previously not extracted bits from the block of data bits for use as a backwards received information code word;

determining whether the backwards received information code word is a valid member of a fixed length code table; and if the backwards received information code word is a valid member of the fixed length code table, then storing the backwards received information code word for subsequent processing.

9. The method of claim 8, further comprising the steps of:

estimating a valid information code word from the backwards received information code word if the backwards received information code word is not a valid member of the fixed length code table; and storing the estimated information code word for subsequent processing.

10. The method of claim 9, wherein the step of estimating the valid information code word comprises estimating an information code word that has a closest Hamming distance from the backwards received information code word.

11. The method of claim 8, further comprising the step of:

if the backwards extracted marker code bits do not constitute a valid one of the plurality of marker code words, then storing a position of the backwards extracted marker code bits.

12. The method of claim 11, further comprising the steps of:

if the stored position of the forward extracted marker code bits is closer to the end of block than is the stored position of the backwards extracted marker code bits, then determining an error interval defined by the stored position of the backwards extracted marker code bits and the stored position of the forward extracted marker code bits; and outputting any stored information code words that are outside the error interval.

13. The method of claim 5, further comprising the steps of:

is if the extracted marker code bits do not constitute a valid one of the plurality of marker code words, then storing a position of the forward extracted marker code bits and starting at the position of the forward extracted marker code bits, processing the block of data bits in a backwards direction by extracting every n+1 bits, where n is an integer greater than or equal to 1, the backwards extracted bits being designated backwards extracted marker code bits;

determining whether the backwards extracted marker code bits constitute a valid one of the plurality of marker code words;

if the backwards extracted marker code bits constitute a valid one of the plurality of marker code words, then for every one of the marker code word bits, extracting n previously not extracted bits from the block of data bits for use as a backwards received information code word;

determining whether the backwards received information code word is a valid member of a fixed length code table; and if the backwards received information code word is a valid member of the fixed length code table, then storing the backwards received information code word for subsequent processing.

14. The method of claim 13, further comprising the steps of:

estimating a valid information code word from the backwards received information code word if the backwards received information code word is not a valid member of the fixed length code table; and storing the estimated information code word for subsequent processing.

15. The method of claim 14, wherein the step of estimating the valid information code word comprises estimating an information code word that has a closest Hamming distance from the backwards received information code word.

16. The method of claim 13, further comprising the steps of:

if the backwards extracted marker code bits do not constitute a valid one of the plurality of marker code words, then storing the position of the backwards extracted marker code bits; and resuming forward processing of the block of data bits from a position after the position of the stored forwards extracted marker code bits.

17. The method of claim 16, further comprising the steps of:

detecting that forward processing of the block of data bits has reached the end of block;

determining any existing error intervals defined by the stored positions of the backwards extracted marker code bits and the stored positions of the forward extracted marker code bits; and outputting any stored information code words that are outside the error intervals.

18. The method of claim 17, further comprising the steps of:

determining whether a count of valid longest marker code words relative to a count of valid shorter marker code words is greater than an expected count of longest marker code words, wherein the expected count is determined from a probability distribution of the data, wherein an unduly high count of valid longest marker code words indicates a possibility of a bit error;

selecting another synchronization position for processing the block of data bits if the count of valid longest marker code words is unduly high; and determining whether the information code words associated with the valid longest marker code words are valid, and if not then selecting another synchronization position for processing the block of data bits.

19. An apparatus for transmitting data over a channel in a telecommunications system, the apparatus comprising:

means for providing a plurality of fixed length code tables, wherein each of the fixed length code tables has a size that is different from a size of every other fixed length code table;

means for encoding the data as a plurality of information code words, wherein each information code word is a selected value from one of the fixed length code tables;

means for providing a plurality of marker codes, wherein the marker codes are variable length codes;

means for associating a unique one of the marker codes with each of the fixed length code tables;

means for generating channel code words by inserting the associated marker code one bit at a time into each of the information code words at a fixed bit interval; and means for transmitting the channel code words over the channel.

20. The apparatus of claim 19, wherein:

the plurality of marker codes is a compact short variable length code that satisfies the relationship:

$$\sum_{k=0}^{M-1} 2^{-l(k)} \leq 1$$

where k is an index that designates one of the marker codes, l(k) is the length of the marker code designated by the index k, and M is the number of marker codes; and at least one of the marker codes is designated as an invalid marker code that is not to be associated with any of the fixed length code tables.

21. The apparatus of claim 20, wherein the means for associating a unique one of the marker codes with each of the fixed length code tables comprises:

means for associating a shortest marker code with a shortest fixed length code table; and means for associating increasingly longer marker codes with increasingly longer fixed length code tables.

22. The apparatus of claim 21, wherein:

for each symbol of data there is a corresponding information code word selected from one of the fixed length code tables; and at least one of the fixed length code tables includes one or more values that were selected for use as information code words, and one or more remaining values that were not selected for use as information code words.

23. An apparatus for receiving data from a channel in a telecommunications system, the apparatus comprising:

means for receiving a block of data bits from the channel, wherein the block of data bits has a first end designated as a start of block, and a second end designated as an end of block;

means for processing the block of data bits in a forward direction, starting at the start of block, by extracting every n+1 bits, where n is an integer greater than or equal to 1, wherein the extracted bits are designated extracted marker code bits;

is means for determining whether the extracted marker code bits constitute a valid one of a plurality of marker code words, wherein the marker codes are variable length codes;

means, responsive to the extracted marker code bits constituting a valid one of the plurality of marker code words, for extracting n previously not extracted bits from the block of data bits for every one of the marker code word bits, wherein the extracted bits are for use as a received information code word;

means for determining whether the received information code word is a valid member of a fixed length code table; and means, responsive to the received information code word being a valid member of the fixed length code table, for storing the received information code word for subsequent processing.

24. The apparatus of claim 23, further comprising:

means for estimating a valid information code word from the received information code word if the received information code word is not a valid member of the fixed length code table; and means for storing the estimated information code word for subsequent processing.

25. The apparatus of claim 24, wherein the means for estimating the valid information code word comprises means for estimating an information code word that has a closest Hamming distance from the received information code word.

26. The apparatus of claim 23, further comprising:

means, responsive to the extracted marker code bits not constituting a valid one of the plurality of marker code words, for storing a position of the forward extracted marker code bits and for processing the block of data bits in a backwards direction, starting at the end of block, by extracting every n+1 bits, where n is an integer greater than or equal to 1, the backwards extracted bits being designated backwards extracted marker code bits;

means for determining whether the backwards extracted marker code bits constitute a valid one of the plurality of marker code words;

means, responsive to the backwards extracted marker code bits constituting a valid one of the plurality of marker code words, for extracting n previously not extracted bits from the block of data bits for every one of the marker code word bits, wherein the extracted bits are for use as a backwards received information code word;

means for determining whether the backwards received information code word is a valid member of a fixed length code table; and means, responsive to the backwards received information code word being a valid member of the fixed length code table, for storing the backwards received information code word for subsequent processing.

27. The apparatus of claim 26, further comprising:

means for estimating a valid information code word from the backwards received information code word if the backwards received information code word is not a valid member of the fixed length code table; and means for storing the estimated information code word for subsequent processing.

28. The apparatus of claim 27, wherein the means for estimating the valid information code word comprises means for estimating an information code word that has a closest Hamming distance from the backwards received information code word.

29. The apparatus of claim 26, further comprising:

means, responsive to the backwards extracted marker code bits not constituting a valid one of the plurality of marker code words, for storing a position of the backwards extracted marker code bits.

30. The apparatus of claim 29, further comprising:

means, responsive to the stored position of the forward extracted marker code bits being closer to the end of block than is the stored position of the backwards extracted marker code bits, for determining an error interval defined by the stored position of the backwards extracted marker code bits and the stored position of the forward extracted marker code bits; and means for outputting any stored information code words that are outside the error interval.

31. The apparatus of claim 237 further comprising:

means, responsive to the extracted marker code bits not constituting a valid one of the plurality of marker code words, for storing a position of the forward extracted marker code bits and for processing the block of data bits in a backwards direction, starting at the position of the forward extracted marker code bits, by extracting every n+1 bits, where n is an integer greater than or equal to 1, the backwards extracted bits being designated backwards extracted marker code bits;

means for determining whether the backwards extracted marker code bits constitute a valid one of the plurality of marker code words;

means responsive to the backwards extracted marker code bits constituting a valid one of the plurality of marker code words, for extracting n previously not extracted bits from the block of data bits for every one of the marker code word bits, wherein the extracted bits are for use as a backwards received information code word;

means for determining whether the backwards received information code word is a valid member of a fixed length code table; and means, responsive to the backwards received information code word being a valid member of the fixed length code table, for storing the backwards received information code word for subsequent processing.

32. The apparatus of claim 31, further comprising:

means for estimating a valid information code word from the backwards received information code word if the backwards received information code word is not a valid member of the fixed length code table; and means for storing the estimated information code word for subsequent processing.

33. The apparatus of claim 32, wherein the means for estimating the valid information code word comprises estimating an information code word that has a closest Hamming distance from the backwards received information code word.

34. The apparatus of claim 31, further comprising:

means, responsive to the backwards extracted marker code bits not constituting a valid one of the plurality of marker code words, for storing the position of the backwards extracted marker code bits; and means for resuming forward processing of the block of data bits from a position after the position of the stored forwards extracted marker code bits.

35. The apparatus of claim 34, further comprising:

means for detecting that forward processing of the block of data bits has reached the end of block;

means for determining any existing error intervals defined by the stored positions of the backwards extracted marker code bits and the stored positions of the forward extracted marker code bits; and means for outputting any stored information code words that are outside the error intervals.

36. The apparatus of claim 35, further comprising:

means for determining whether a count of valid longest marker code words relative to a count of valid shorter marker code words is greater than an expected count of longest marker code words, wherein the expected count is determined from a probability distribution of the data, wherein an unduly high count of valid longest marker code words indicates a possibility of a bit error;

means for selecting another synchronization position for processing the block of data bits if the count of valid longest marker code words is unduly high; and means for determining whether the information code words associated with the valid longest marker code words are valid, and if not then selecting another synchronization position for processing the block of data bits.

* * * * *